US010774682B2

(12) United States Patent
Zhu et al.

(10) Patent No.: US 10,774,682 B2
(45) Date of Patent: Sep. 15, 2020

(54) ADVANCED HIGH TEMPERATURE AND FATIGUE RESISTANT ENVIRONMENTAL BARRIER COATING BOND COAT SYSTEMS FOR SIC/SIC CERAMIC MATRIX COMPOSITES

(71) Applicant: U.S.A. as represented by the Administrator of the National Aeronautics and Space Administration, Washington, DC (US)

(72) Inventors: Dongming Zhu, Westlake, OH (US); Janet B. Hurst, Columbia Station, OH (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 462 days.

(21) Appl. No.: 13/923,450

(22) Filed: Jun. 21, 2013

(65) Prior Publication Data
US 2013/0344319 A1 Dec. 26, 2013

Related U.S. Application Data

(63) Continuation of application No. 61/663,201, filed on Jun. 22, 2012.

(51) Int. Cl.
*F01D 25/00* (2006.01)
*C04B 41/50* (2006.01)
*C04B 41/00* (2006.01)
*C04B 41/87* (2006.01)
*C22C 29/18* (2006.01)
*C22C 32/00* (2006.01)
*C23C 16/42* (2006.01)

(52) U.S. Cl.
CPC .......... *F01D 25/005* (2013.01); *C04B 41/009* (2013.01); *C04B 41/5042* (2013.01); *C04B 41/5044* (2013.01); *C04B 41/87* (2013.01); *C22C 29/18* (2013.01); *C22C 32/0078* (2013.01); *C23C 16/42* (2013.01); *Y10T 428/264* (2015.01)

(58) Field of Classification Search
CPC . F01D 25/005; C04B 41/5042; C04B 41/009; C04B 41/87; C04B 41/5044; Y10T 428/264; C22C 29/18; C22C 32/0078; C23C 16/42
See application file for complete search history.

(56) References Cited

U.S. PATENT DOCUMENTS 6,777,093 B1 8/2004 Ojard et al.
7,060,360 B2 6/2006 Eaton et al.
(Continued)

*Primary Examiner* — Jonathan C Langman
(74) *Attorney, Agent, or Firm* — Robert H. Earp, III; Mark Wolfgang; Helen M. Galus

(57) ABSTRACT

Advanced environmental barrier coating bond coat systems with higher temperature capabilities and environmental resistance are disclosed. These bond coat systems can be applied to ceramic substrates such as SiC/SiC ceramic matrix composite substrates, and can provide protection from extreme temperature, mechanical loading and environmental conditions, such as in high temperature gas turbines. Example bond coat systems can include either an advanced silicon/silicide component, an oxide/silicate component, or a combination thereof.

14 Claims, 13 Drawing Sheets

(56) References Cited

U.S. PATENT DOCUMENTS

| | | | |
|---|---|---|---|
| 7,115,319 B2 * | 10/2006 | Raybould | B23K 35/30 |
| | | | 428/450 |
| 7,300,702 B2 | 11/2007 | Li et al. | |
| 7,354,651 B2 | 4/2008 | Hazel et al. | |
| 7,442,444 B2 | 10/2008 | Hazel et al. | |
| 7,740,960 B1 | 6/2010 | Zhu et al. | |
| 7,763,356 B2 | 7/2010 | Berczik et al. | |
| 2005/0026770 A1 * | 2/2005 | Zhu | C04B 35/486 |
| | | | 501/103 |
| 2006/0280962 A1 | 12/2006 | Hazel et al. | |
| 2009/0169873 A1 * | 7/2009 | Louchet-Pouillerie | |
| | | | C04B 41/009 |
| | | | 428/334 |
| 2010/0080984 A1 * | 4/2010 | Lee | C04B 35/16 |
| | | | 428/334 |
| 2010/0104859 A1 * | 4/2010 | Berczik | C22C 27/04 |
| | | | 428/332 |
| 2010/0119718 A1 * | 5/2010 | Tulyani | C04B 41/009 |
| | | | 427/372.2 |
| 2010/0129673 A1 | 5/2010 | Lee | |
| 2010/0159253 A1 * | 6/2010 | Kirby | C04B 41/009 |
| | | | 428/446 |
| 2011/0027559 A1 * | 2/2011 | Kirby | C04B 35/16 |
| | | | 428/215 |
| 2011/0097589 A1 * | 4/2011 | Meschter | C04B 35/58085 |
| | | | 428/428 |
| 2011/0151239 A1 * | 6/2011 | Lane | C04B 35/185 |
| | | | 428/312.8 |
| 2012/0328886 A1 * | 12/2012 | Schmidt | C23C 28/044 |
| | | | 428/428 |

* cited by examiner

Selected coating materials

| Coating | Thick. (μm) | Composition (at.%) | | | | | |
|---|---|---|---|---|---|---|---|
| | | Si | Y | Gd | Yb | Hf | N |
| YbGdYSi | | 62.19 | 11.05 | 10.01 | 16.74 | | |
| YbGdYSi | 0.17 | 22.12 | 6.57 | 26.17 | 45.14 | | |
| YbGdYSi | 26.4 | 63.25 | 10.33 | 10.96 | 15.47 | | |
| YbGdYSi | 22.7 | 61.54 | 8.69 | 9.8 | 19.97 | | |
| YbGdSi | 27.8 | 73.69 | | 8.33 | 17.98 | | |
| YbGdSi | 28.4 | 71.61 | 0.03 | 10.21 | 18.15 | | |
| YbGdSi | 27.6 | 73.63 | 0.06 | 7.13 | 19.18 | | |
| YbGdSi | 25.2 | 75.82 | 0.09 | 9.78 | 14.31 | | |
| YbGdSi | 24.7 | 75.04 | 0.04 | 10.94 | 13.98 | | |
| YbSi | 20.7 | 80.66 | 0.05 | 0.1 | 19.2 | | |
| YbYSi | | 78.39 | | | 16.26 | 5.35 | |
| YbHfSi | 17.7 | 62.64 | | 0.05 | 27.39 | 1.57 | 8.35 |
| YbHfSi | 24.1 | 66.19 | | 0.09 | 17.88 | 1.72 | 14.12 |
| YbHfSi | 19.6 | 71.05 | | 0.11 | 27.48 | 1.36 | |
| YbHfSi | 20 | 59.22 | | 0.11 | 23.22 | 0.95 | 16.5 |
| YbHfSi | 24.4 | 72.62 | | 0.14 | 22.72 | 4.52 | |
| YbSi | 20.3 | 59.04 | | 0.11 | 17.98 | | 16.37 |

FIG. 11A

| Coating | Thick. (μm) | Composition (at.%) | | | | | | |
|---|---|---|---|---|---|---|---|---|
| | | Si | Zr | Y | Ta | Hf | Yb | Gd |
| YSi | 25.4 | | | | | | | |
| ZrSi+Y | | | | | | | | |
| ZrSi+Y | 40 | 42.03 | 48.82 | 9.15 | | | | |
| ZrSi+Ta | | | | | | | | |
| ZrSi+Ta | 36.6 | 34.08 | 53.07 | | 12.84 | | | |
| HfSi + Si | 11 | | | | | | | |
| HfSi + YSi | 21 | 50.16 | | 26.69 | | 23.15 | | |
| HfSi+YSi+Si | 28.2 | 61.99 | | 20.43 | | 17.58 | | |
| YbSi | 9.6 | 43.82 | | | | | 56.18 | |
| HfSi + YbSi | 15 | 44.86 | | | | 20.08 | 35.06 | |

FIG. 11B

| Coating composition (at.%) | | | | | Coating Thickness (µm) |
| --- | --- | --- | --- | --- | --- |
| Ti | Al | Cr | Ta | Si | |
| 25 | 23 | 27.7 | 23.5 | 0 | 19.3 |
| 40.7 | 7.9 | 38.2 | 12.9 | 0 | 11.9 |
| 28.4 | 28.6 | 31.9 | 10.7 | 0 | 14 |
| 31.2 | 35.8 | 32.9 | 0.1 | 0 | |
| 28.1 | 27.9 | 23.6 | 20.4 | 0 | |
| 12.5 | 30.6 | 27.2 | 29.7 | 0 | |
| 29.1 | 32 | 30.4 | 8.5 | 0 | |
| 29.1 | 32 | 30.4 | 8.5 | 0 | |
| 22.7 | 44.4 | 21.5 | 11.5 | 0 | |
| 25.8 | 35.9 | 24.7 | 13.6 | 0 | |
| 25.2 | 18.7 | 26.5 | 14.9 | 14.7 | 17.3 |
| 27.2 | 8.2 | 40 | 14.1 | 10.4 | 15 |
| 19.1 | 29.3 | 38.9 | 12.7 | 0 | 17.4 |
| 30.3 | 7.86 | 56 | 0.3 | 5.57 | 18.3 |
| 38 | 14.4 | 41 | 0 | 6.7 | 14.7 |
| 35.8 | 9.5 | 23.5 | 3.3 | 28 | 19.9 |
| 22.4 | 18.1 | 18.1 | 6.3 | 35.1 | 19.7 |
| 22.8 | 23.7 | 19.7 | 6.1 | 28.4 | |

FIG. 11C

ADVANCED HIGH TEMPERATURE AND FATIGUE RESISTANT ENVIRONMENTAL BARRIER COATING BOND COAT SYSTEMS FOR SIC/SIC CERAMIC MATRIX COMPOSITES

CROSS-REFERENCE TO RELATED APPLICATIONS

This application claims the benefit of U.S. Provisional Patent application Ser. No. 61/663,201 entitled 'Advanced High Temperature and Fatigue Resistant Environmental Barrier Coating Bond coat Systems for SiC/SiC Ceramic Matrix Composites' and filed Jun. 22, 2012. The entirety of the above-noted application is incorporated by reference herein.

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

TECHNICAL FIELD

The general field of this innovation is environmental barrier coatings, and embodiments relate more specifically to environmental barrier coatings for silicon-based ceramic components.

BACKGROUND

In components subjected to high temperatures, high velocity combustion gas and corrosive conditions, such as those hot sections of gas turbines and other heat engines, coatings are frequently used to protect such components from those conditions, improving lifespan and reliability. Environmental barrier coating (EBC) systems are thin ceramic layers, generally applied by plasma spraying and/or physical vapor deposition, including Atmospheric and Low Pressure Plasma Spray, Electron Beam-Physical Vapor Deposition (EB-PVD), or Plasma-Spray Physical Vapor Deposition (PS-PVD), and/or other deposition techniques such as High temperature Vacuum Vapor Deposition, Chemical Vapor Deposition, Magnetron or Cathodic Arc Physical Vapor Deposition, Polymer Derived Coatings and Slurry coatings, that are used to protect monolithic ceramic or ceramic matrix composite (CMC) components, from high temperature, water vapor and/or other corrosive combustion gas attacks in gas turbine or other heat engines, and resistant to thermal cycling and mechanical fatigue operating conditions.

Future development in gas turbine engines will necessitate improvements in conventional environmental barrier coatings designed to protect gas turbine engine hot section Si-based ceramic matrix composite (e.g., SiC/SiC CMC) and monolithic (e.g., $Si_3N_4$) ceramic components, in order to meet future engine reduced weight, higher fuel efficiency and lower emission goals. A coating system consisting of a high temperature capable advanced zirconia-based (or hafnia-based) oxide top coat (thermal barrier) and a less temperature capable rare earth silicates and mullite/barium-strontium-aluminosilicate (BSAS)/Si environmental barrier is a state-of-the-art protective T/EBC coating system for the Si-based ceramic applications. The high temperature capability and high stability oxide TBC and lower stability silicate EBC combined system is also the only possible protective coating solution for ceramic components under very high temperature, and/or high gas flow velocity water vapor combustion environments, since the silicate coatings alone cannot effectively protect the component due to the Si species volatility and low temperature capability. In U.S. Pat. No. 7,740,960 to Zhu et al., the entirety of which is incorporated herein by reference, an advanced multilayer graded environmental barrier coating system was disclosed for 3000° F. (1650° C.) environmental barrier coating SiC/SiC turbine ceramic matrix composition applications, including advanced environmental barrier coating top coat, and strain tolerant interlayers, silica activity graded environmental barrier and first generation ceramic and ceramic rare earth silicate based and rare earth aluminosilicate based composite self-healing bond coats.

The developments for advanced turbine environmental barrier coatings will require the advanced environmental barrier coatings capable of achieving 2700°+F. (1482° C.) bond coat temperature and 3000° F. (1650° C.) surface temperatures and with thin coating configurations (typically 5-10 mils, overall coating thickness 127-250 micrometers). Additionally, resistance to impact, erosion and thermo-mechanical fatigue are also becoming critical to ensure the environmental barrier coating-CMC system integrity and durability under realistic engine operating conditions. One major issue for the current environmental barrier coating development is the undesirable low temperature capability silicon or silicon containing bond coat systems, which have a melting point of 1410° C. or below. In addition, bond coats should be dense, possess high strength and low oxygen activity to protect the CMC substrates, thus typical ceramics or ceramic compounds will not have the toughness, strength and critical chemical attributes to meet durability requirements under the thermal cyclic and mechanical fatigue loading at high temperature.

In order to develop the next generation high performance, durable 2700° F. (1482° C.) environmental barrier coating systems, advanced high temperature cable strength, non-silicon based bond coats will be needed to advance the next generation turbine engine technologies.

SUMMARY

The following presents a simplified summary of the innovation in order to provide a basic understanding of some aspects of the innovation. This summary is not an extensive overview of the innovation. It is not intended to identify key/critical elements of the innovation or to delineate the scope of the innovation. Its sole purpose is to present some concepts of the innovation in a simplified form as a prelude to the more detailed description that is presented later.

The innovation disclosed and claimed herein, in aspects thereof, comprises systems, methods and articles that can include environmental barrier coating bond coat systems. One example article can include a substrate, such as a SiC/SiC ceramic matrix composite substrate, and a bond coat system. The bond coat system can include a bond coat that can include one or more of a silicon/silicide component or an oxide/silicate component. Optionally, interlayers can be included between the substrate and bond coat and external to the bond coat, and an optional environmental barrier coating top coat can be included external to the bond coat system.

To the accomplishment of the foregoing and related ends, certain illustrative aspects of the innovation are described herein in connection with the following description and the annexed drawings. These aspects are indicative, however, of but a few of the various ways in which the principles of the innovation can be employed and the subject innovation is intended to include all such aspects and their equivalents. Other advantages and novel features of the innovation will become apparent from the following detailed description of the innovation when considered in conjunction with the drawings.

BRIEF DESCRIPTION OF THE DRAWINGS

FIGS. 11A, 11B, and 11C include specific examples of compositions useable in connection with various aspects of the subject innovation.

DETAILED DESCRIPTION

Figure 1:
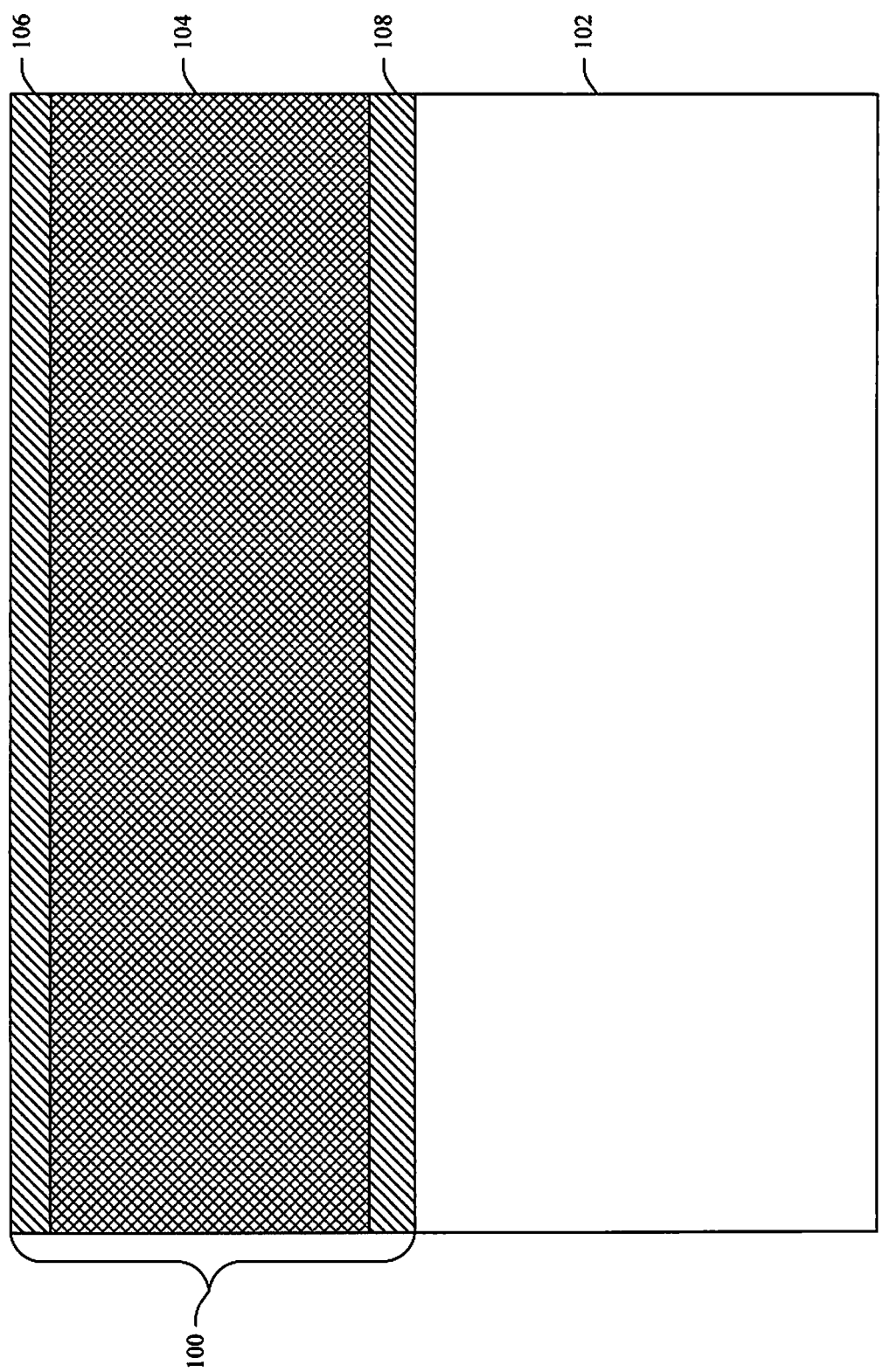
FIG. 1 illustrates a first example environmental barrier coating (EBC) bond coat system in accordance with aspects of the subject innovation.

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details. In other instances, well-known structures and devices are shown in block diagram form in order to facilitate describing the innovation.

In various aspects, embodiments of the subject innovation can include systems, articles, and methods that can employ an advanced high temperature capable, low expansion and low diffusion environmental barrier coating (EBC) bond coat system for Si-based ceramics and ceramic matrix composites (CMCs). Various aspects of the subject innovation can provide coating compositions and architecture arrangements that can achieve exceptional environmental barrier coating bond coat adhesion, oxidation and fatigue resistance, and environmental protection performance, along with self-healing capabilities that can ensure log-term durability for Si-based turbine ceramic components. Environmental barrier coating bond coat systems, articles, and methods of the subject innovation can be employed in thin environmental barrier coating configurations, which can help enable the realization of ceramic turbine engine SiC/SiC CMC combustor and turbine airfoil applications.

Referring initially to the drawings, FIG. 1 illustrates a first example environmental barrier coating (EBC) bond coat system 100 in accordance with aspects of the subject innovation. The EBC bond coat systems, articles, and methods employed in various aspects of the subject innovation can utilize compositions and architecture designs disclosed herein to enhance the coating high temperature stability, high toughness and strength, and durability performance. The EBC bond coat system 100 is the coating layer directly adjacent to the substrate 102 (e.g., SiC/SiC ceramic matrix composite substrate, etc.), as shown in FIG. 1, which can improve environmental barrier coating adhesion and bonding strength, provide enhanced environmental protection, and, in various aspects of the subject innovation, can be designed to incorporate dynamic slow growth protective scale formation for oxidation resistance and seal healing. EBC bond coat system 100 can include a bond coat 104, which can be as described herein. In various aspects, environmental barrier bond coats 104 of the subject innovation can have any of a range of coating thicknesses, e.g., ranging from around 10 micrometers to around 200 micrometers. Layers 106 and 108, which can be included in some embodiments and can be excluded in other embodiments, can be interlayers, e.g., diffusion barriers with crystalline and/or amorphous coatings as described herein, with the thickness ranging from around 10 micrometers to around 200 micrometers.

EBC bond coat systems in accordance with the subject innovation can comprise one or both of two composition categories, referred to herein as Group A (also referred to herein as an "silicon/silicide component") and Group B (also referred to herein as a "oxide/silicate component"). Group A and Group B have low oxygen activities (or called "oxygen getter") and higher oxygen but lower silica activities, respectively. Members of Group A generally have superior oxidation resistance, while members of Group B generally have superior temperature resistance and combustion environmental resistance. Group A (the "silicon/silicide component") can be an advanced silicon based alloy system as described herein, e.g., a rare earth (RE) based or doped silicon alloy or compound. Rare earth metals that can be employed in connection with group A include Ytterbium, Gadolinium, Neodymium, Samarium, Lutetium, Erbium, Europium, Terbium, Dysprosium, Holmium, Lanthanum, Cerium, Praseodymium, Promethium, Thulium (i.e., lanthanides), plus Yttrium and Scandium; Group A can also include doped Carbide-Nitrides of these. Group B (the "oxide/silicate component") can include highly stable Oxide and Silicate based material systems described herein. Various embodiments can employ any of a variety of silicon/silicide components, or any of a variety of oxide/silicate components, or a combination of both. In some embodiments, bond coats of the subject innovation can include $HfO_2$ (or $ZrO_2$, etc.) and Si/alloyed/doped Si, optionally with various dopants as described herein. Various embodiments of bond coats of the subject innovation incorporating $HfO_2$ and Si or their alloys have been demonstrated to have excellent temperature and environmental resistance, including resistance to CMAS (Calcium Magnesium Aluminosilicate) attack.

EBC bond coats in accordance with the subject innovation can have advanced multi-component compositions, which can be arranged to form thermodynamically stable, multiscale composites that have superior performance as compared to the current state of the art silicon bond coat. Bond coat systems and articles in accordance with the subject innovation can have thermal expansion co-efficients in a range from $4\text{-}6 \times 10^{-6}$ m/m·K, comparable to the Si-based ceramics, and conventional Silicon bond coats. Coatings of the subject innovation can be processed consistent with any of the current state-of-the-art coating processing methods.

In contrast to conventional systems, embodiments of the subject innovation can comprise systems articles and methods that can utilize multi-component bond coat systems, which can include one or more of alloy doped Silicon; alloy-doped or silicon-rich Rare Earth (RE) Silicides; Rare Earth (RE) doped transition metal Silicides; Nitrogen, Boron or Carbon doped metal Silicon alloys or compounds; or advanced oxides or silicates. Embodiments of the subject innovation can form highly stable bond coat systems useable in connection with SiC/SiC CMC components.

Group A (the "silicon/silicide component") useable in connection with bond coat systems disclosed herein, can include (a) Rare Earth doped or alloyed Silicon, (b) Rare Earth (RE) Silicides (e.g., any of various stoichiometry compounds, such as $RE_5Si_3$, $RE_5Si_4$, $RESi$, $RE_3Si_5$, $RESi_2$, etc. and also particularly non-stoichiometry silicide compound compositions disclosed herein for optimum performance enhancement), which can include Ytterbium Silicides, Yttrium Silicides, Gadolinium Silicides, Erbium Silicides, etc., (c) Rare Earth (RE) Silicides doped with Zirconium, Hafnium, Aluminum or a combination thereof, (d) Rare Earth (RE) doped refractory transition metal Silicides, which can include Rare Earth (RE) doped or alloyed Zirconium Silicides, Hafnium Silicides, Tantalum Silicides, Titanium Silicides, Chromium Silicides, Iron Silicides, Molybdenum Silicides, Niobium Silicides, Aluminum Silicides, etc., (e) Rare Earth (RE) or Aluminum doped Palladium, Irridium and Platinum Silicides; (f) Rare Earth (RE) doped or non-doped Tantalum-, Titanium-, Chromium-, Molybdenum-, Niobium-, Aluminum-Silicon Carbon, Boron, Nitride compounds with Silicon, such as $Ti_x(AlCrTa)_y$ Si—CN, $Ti_x(AlCrTa)_y$Si—BN, $Ti_2CrTa(Si)$—N, ZrTaSi—N, or $Ta_2AlSi$—CN, etc.; or (g) any combinations of any of the foregoing. The Group A can be doped or oxidized with minor "oxygen" dopant or with oxygen gradients.

Group B (the "oxide/silicate component") useable in connection with bond coat systems disclosed herein can significantly improve the temperature capability, environmental stability and strength capability, and can include (a) Rare Earth (RE) oxides (e.g., $RE_2O_3$), which can include Ytterbium Oxide, Yttrium Oxide, Gadolinium Oxide, Europium Oxide, etc.; (b) Rare Earth Mono-Silicates ($RE_2SiO_5$) or Di-Silicates ($RE_2Si_2O_7$) such as $Yb_2SiO_5$, $Yb_2Si_2O_7$, $Y_2SiO_5$, $Gd_2Si_2O_7$, $Gd_2SiO_5$ and $Gd_2Si_2O_7$; (c) other oxides such as Barium Oxide (BaO), Strontium Oxide (SrO), etc.; (d) Titanium and Tantalum-doped and un-doped Rare Earth Zirconium and Hafnium Pyrochlore Oxides such as $RE_2Zr_2O_7$ and $RE_2Hf_2O_7$; (e) Rare Earth Aluminum Garnets (REAG or $Y_3Al_5O_{12}$, such as YAG, YbAG), Rare Earth Aluminum Monoclinics (REAM, such as YAM, YbAM) or Rare Earth Aluminum Perovskites (REAP or $REAlO_3$, such as YAP, YbAP); (f) Zirconium Oxide ($ZrO_2$) or Hafnium Oxide ($HfO_2$, e.g., t' Hafnium Oxide, monoclinic Hafnium Oxide, etc.), or Rare Earth (RE) Oxide Doped $ZrO_2$ or $HfO_2$, or Transition Metal doped, and/or $SiO_2$ doped or alloyed $ZrO_2$ and $HfO_2$; or (g) any combinations of any of the foregoing. Silicates of Group B can include both rare earth rich compounds and silica ($SiO_2$) rich compounds.

Referring again to FIG. 1, in various embodiments, each of layer 106 and layer 108 can be a diffusion barrier, which in one embodiment can be a thin crystalline and/or amorphous coating of a silicon/silicide component (e.g., a member of Group A), which can have the capability of operating at temperatures of at least 1600° C. (2912° F.), and can have ultra low oxygen and water vapor diffusivity. In various embodiments either or both of 106 (near the EBC top coats/bond coat interface) and layer 108 (near the bond coat/CMC interface) can comprise an extremely thin layered low diffusional coating, and can incorporate, utilizing a higher silicon content than bond coat 104, high temperature capable amorphous or crystalline phased $Ta_x$SiCN, $RETa_x$-SiCN, $Ti_x(AlCrTa)_y$SiCN, or other compositions from Groups A or B. As mentioned above, in some embodiments, layers 106 and 108 can be included, while in other embodiments they can be omitted. In the example embodiment shown in FIG. 1, bond coat 104 can be a multicomponent doped bond coat, comprising a silicon/silicide component (e.g., from Group A).

Figure 2:
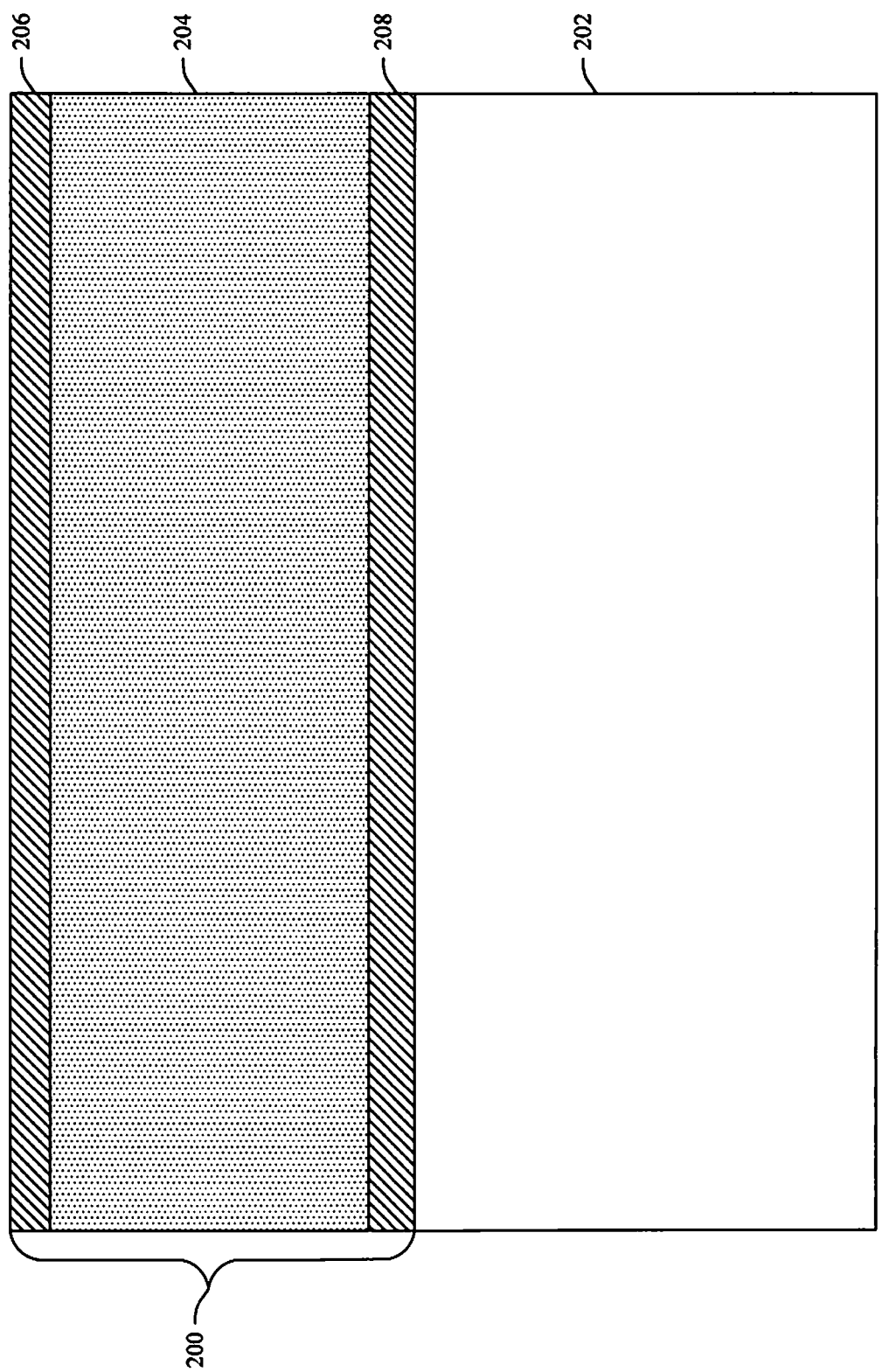
FIG. 2 illustrates a second example EBC bond coat system in accordance with aspects of the subject innovation.

FIG. 2 illustrates a second example EBC bond coat system 200 in accordance with aspects of the subject innovation. Substrate 202 and layers 206 and 208 (which can be optional, as with EBC bond coat system 100) can be as described elsewhere herein in connection with analogous components, e.g., those of FIG. 1. Bond coat 204 can be a multicomponent doped bond coat, comprising an oxide/silicate component (e.g., from Group B). Thus, in various embodiments, members of Group A or Group B, either individual members or combination thereof, can be used for EBC bond coats, as shown in FIGS. 1 and 2.

Figure 3:
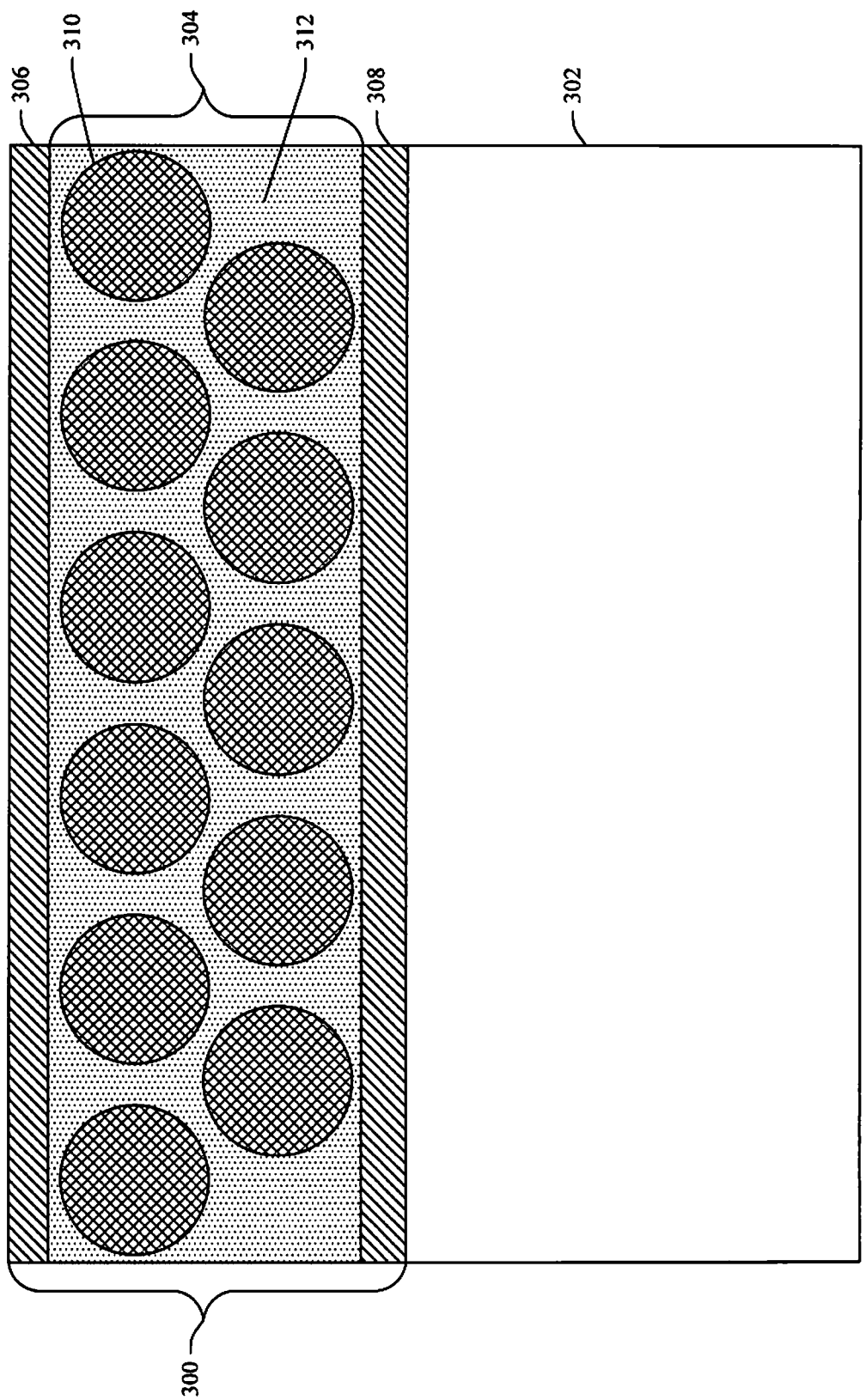
FIG. 3 illustrates a third example EBC bond coat system in accordance with aspects of the subject innovation.

Turning to FIG. 3, illustrated is a third example of an EBC bond coat system 300 comprising a composite bond coat 304 in accordance with aspects of the subject innovation. Substrate 302 and layers 306 and 308 can be as described above in connection with FIGS. 1 and 2 (with layers 306 and 308 again optional). Bond coat 304 can comprise a composite of both a silicon/silicide component (e.g., from Group A) and an oxide/silicate component (e.g., from Group B), such as an oxide/silicate component (e.g., from Group B) as reinforcements 310 and embedded in a layer 312 composed of a silicon/silicide component (e.g., from Group A) or vice versa, as shown in bond coat 304. As examples of silicon/silicide components useable in connection with bond coat 304, of the Rare Earth Silicides, dopants such as Aluminum can ensure superior cyclic and oxidation resistance under lower temperature conditions, which can prevent "pesting" from occurring. The combination of components from both Group A and Group B can provide superior integrity and performance for the bond coat, via the sophisticated composite system of an Oxide-Silicate in combination with a Silicon alloy. An extremely thin layered low diffusional coating near the bond coat/substrate (e.g., CMC) interface at 308, and a similar layer near the EBC top coat/bond coat interface at 306, can be incorporated, and can utilize a higher silicon content, high temperature capable amorphous or crystalline phased $Ta_x$SiCN, $RETa_x$SiCN, $Ti_x(AlCrTa)_y$S-iCN, for example, or other members or combinations thereof selected from Groups A and B.

Figure 4:
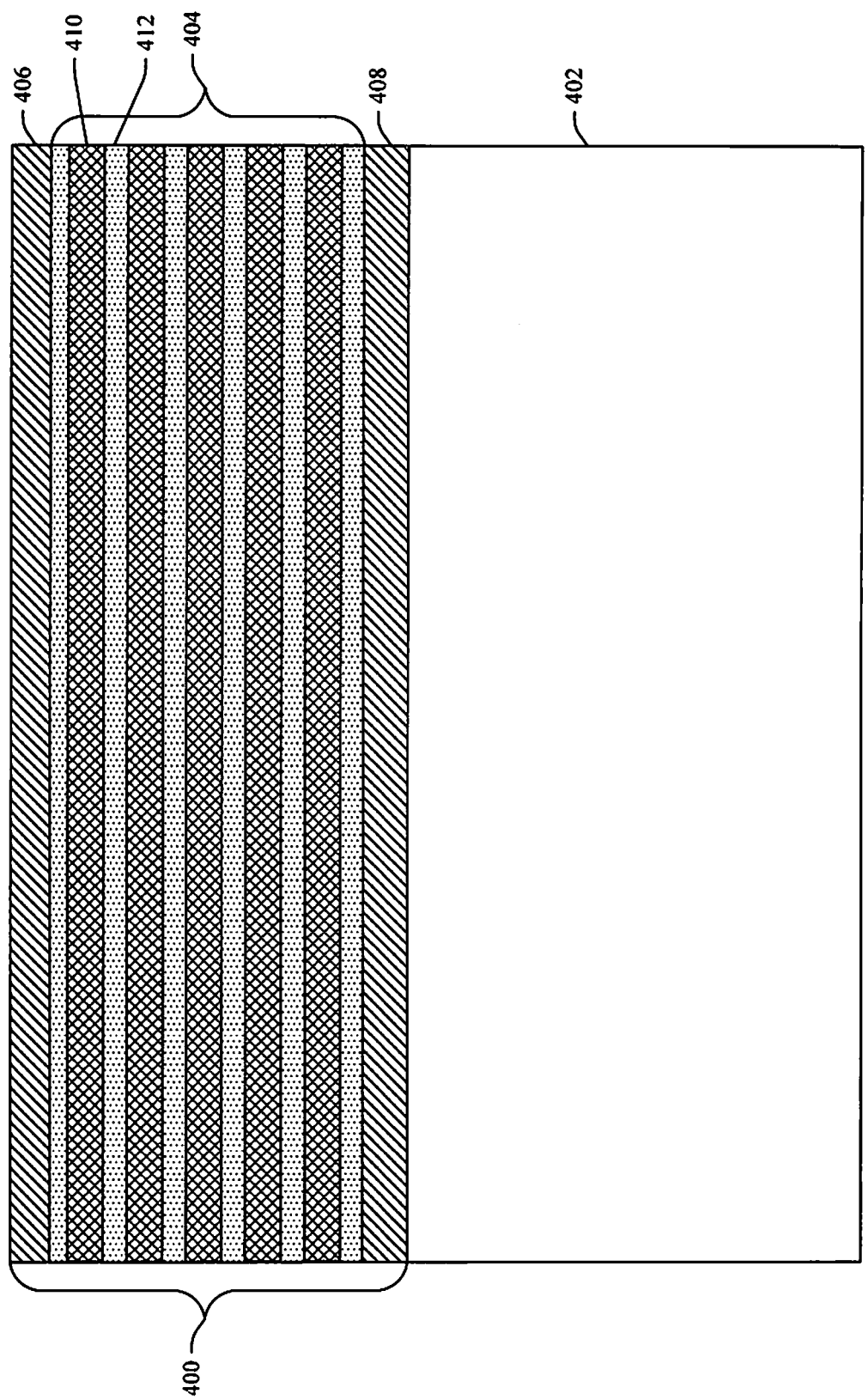
FIG. 4 illustrates a fourth example EBC bond coat system in accordance with aspects of the subject innovation.

FIG. 4 illustrates a fourth example embodiment of an EBC bond coat system 400 comprising a layered composite bond coat 404 in accordance with aspects of the subject innovation. Substrate 402 and layers 406 and 408 can be as described in connection with similar components of FIGS. 1, 2, and 3. Bond coat 404 can be arranged in a layered composite configuration with alternating layers 410 and 412 of a silicon/silicide component and an oxide/silicate component, or vice versa. In other aspects, more than two alternating layers can be employed. EBCs, when included, can be as described herein, for example, comprising a high stability multicomponent $HfO_2$-$RE_2O_3$—$SiO_2$/$RE_2Si_{2-x}O_{7-2x}$; in other embodiments, other components described herein can be used additionally or alternatively in connection with environmental barrier coats.

In various embodiments of the innovation, silicon/silicide components (e.g., from Group A) can be employed that can have relatively high silicon content designs (silicon-rich, off-stoichiometry silicide compositions) to provide superior oxidation resistance. In embodiments employing doped Silicon alloys or Silicides, such high silicon content can correspond to silicon molar concentration in a range from 50 to 99.5 molar %. For embodiments employing Rare Earth Silicides and other doped Silicide embodiments, silicon-rich silicides such as $RE_3Si_5$ and $RESi_2$ can provide such a relatively high silicon content, for example, and also $RE_3Si_{5+x}$ and $RESi_{2+x}$, where the "x" indicates a modified composition with the silicon rich silicides for superior performance.

Figure 5:
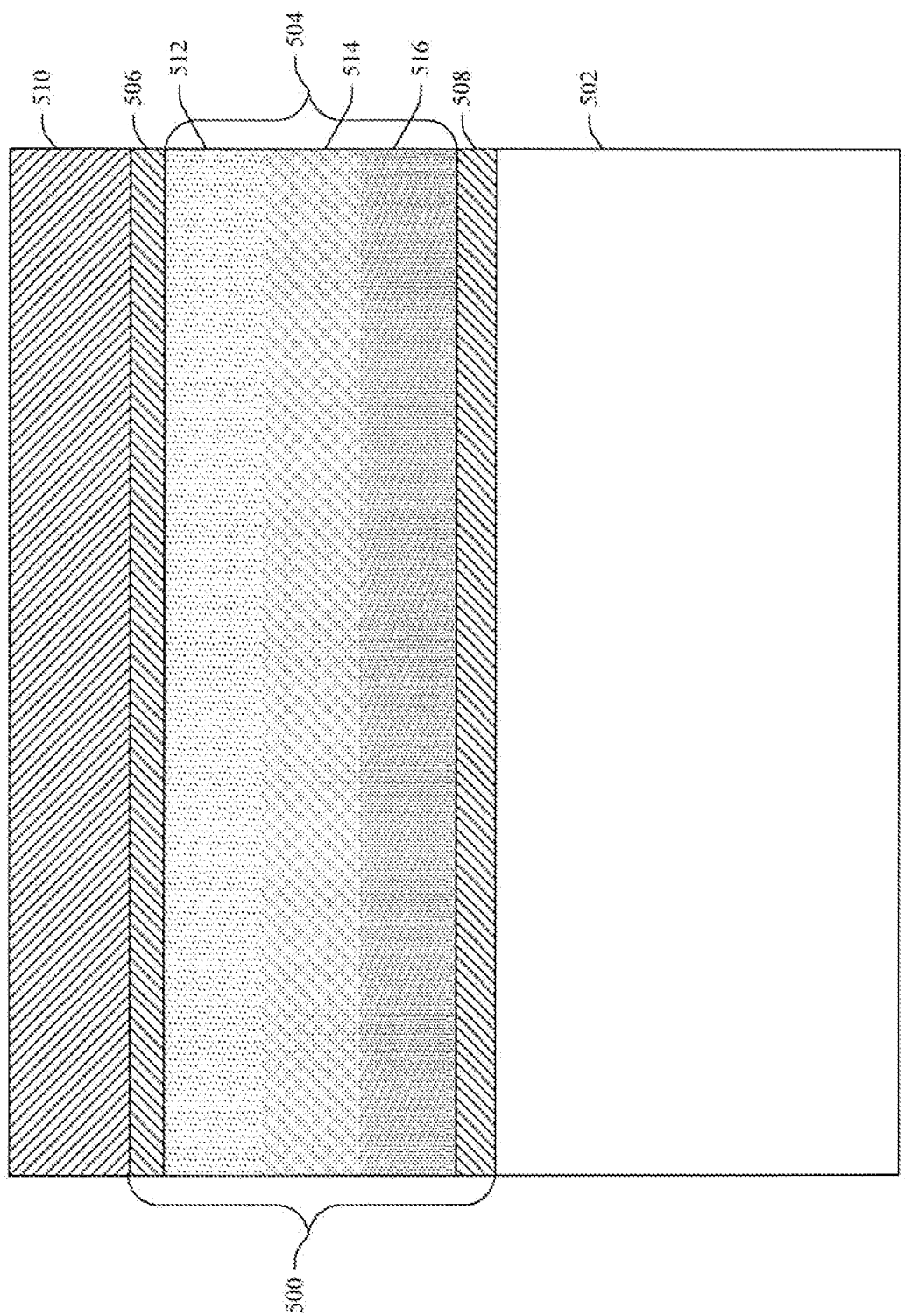
FIG. 5 illustrates an example embodiment of an EBC bond coat system comprising a bond coat with a mixture phased region, in accordance with aspects of the subject innovation.

FIG. 5 illustrates an example embodiment of an EBC bond coat system 500 comprising a bond coat 504 with a mixture phased region, in accordance with aspects of the subject innovation. Substrate 502 and layers 506 and 508 can be as described in connection with other embodiments (again, layers 506 and 508 can be optional). FIG. 5 also shows a thermal and environmental barrier coating (T/EBC) 510, which can be optionally included in any embodiments described herein. Bond coat 504 can comprise a mixture phased region 512-516 of increasing silicon or silica content or silica activity at portions of bond coat 504 closer to the substrate 502 (e.g., CMC) when compared with portions more distant from substrate 502. The mixture phased region is indicated in FIG. 5 by three sub-regions 512, 514, and 516, although greater or fewer sub-regions can be included in various embodiments, or continuous variation in silicon or silica content or activity can be employed, etc. One example embodiment employed a mixture phased region of RESi, or RESi(O), $RE_3Si_5$ or $RE_3Si_5$(O) and $RESi_2$(O), with the silicon concentration between 50 and 67 molar %, and can provide excellent temperature capability and oxidation resistance. Various embodiments can have a silicon molar concentration in the range from 62 to 70%. Other embodiments of the subject innovation can have atomic percentages for silicon between 55 and 95%, or between 60 and 90%, or between 65 and 95%, etc. Silicon-rich bonded Silicide composites can provide coatings with excellent temperature capability and durability. In the $Ti_x(AlCrTa)_ySi$ and $Ti_x(AlCrTa)_ySi$—(C)N type coating systems, high silicon concentration (e.g., up to 60 molar %) can produce coatings with extremely high temperature capability (1600-1700° C.), exceptional mechanical properties, and low diffusivity amorphous coating formation.

Bond coats that comprise both a silicon/silicide component (e.g., from Group A) and an oxide/silicate component (e.g., from Group B) can provide for a coating with capability. The oxide/silicate component (e.g., refractory metal or rare earth oxides or silicates, etc.) can further protect the silicon/silicide component from oxidation, can improve the coating strength and toughness, creep and fatigue resistance, and can prevent the coating from "Pesting" in certain lower temperature conditions. The advanced RE and RE doped Silicon or Silicide of Group A and the oxide-silicate compositions of Group B can also enhance the bond coat self-healing in the event cracking develops, and can also provide excellent oxidation and combustion environment protection under extreme environments.

Figure 6:
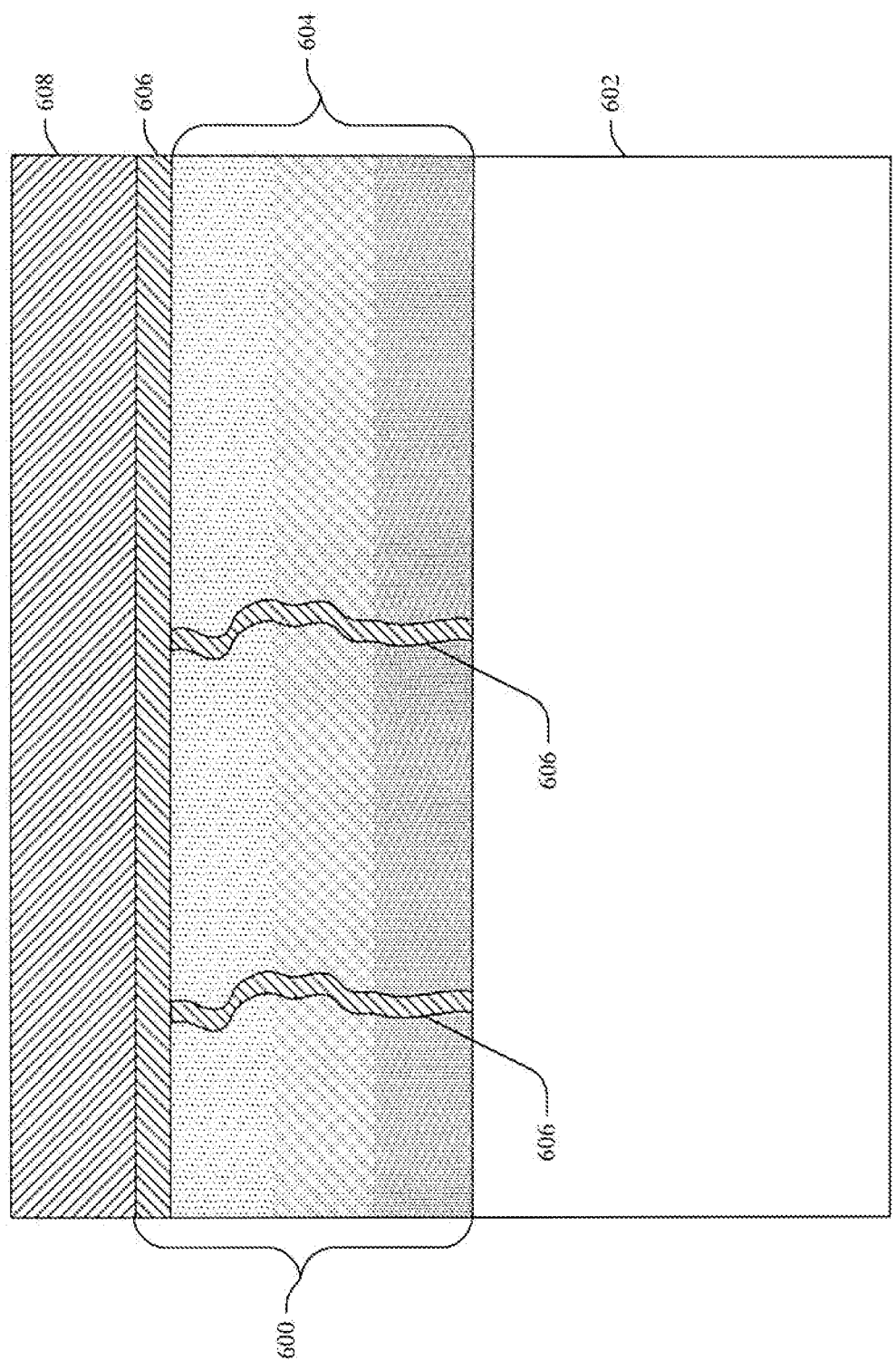
FIG. 6 illustrates an example bond coat system with self-healing in accordance with aspects of the subject innovation.

FIG. 6 illustrates an example bond coat system 600 with self-healing in accordance with aspects of the subject innovation. The substrate 602 can be as described elsewhere herein, and thin layers diffusion barriers can be included, although not shown in FIG. 6. Bond coat 604 can be any of a variety of bond coats as described herein, although the bond coat illustrated is similar to that illustrated in connection with FIG. 5. Bond coat 604 can comprise a silicon/silicide component, an oxide/silicate component, or a combination of the two, and can have a graded composition as described above in connection with mixture phased region 512-516 of FIG. 5, with increased Silicon or Silica activity, and reduced oxygen activity toward the interface between bond coat 604 and substrate 602 (e.g., SiC—SiC ceramic or CMC substrate, etc.). Bond coat 604 is capable of self-healing cracks and self-growth of a low silica activity and high stability EBC, as shown at 606. Optionally, a thermal and environmental barrier coating (T/EBC) top coat 608 can be included, but it need not be included in all embodiments, due to the ability of bond coat 604 to self-grow an EBC for superior stress and fatigue resistance.

In various aspects of the subject innovation, environmental barrier coating bond coat systems described herein can employ any of a variety of compositions and architectures described herein. Experimental results obtained in connection with embodiments of EBC bond coat systems useable in connection with Si-based ceramic and CMC component applications have demonstrated higher temperature capabilities and durability than state-of-the-art coatings in laboratory simulated engine environments. Various aspects and embodiments of bond coating systems disclosed herein have been successfully tested and demonstrated at the sub-element and sub-component levels.

In various aspects, embodiments can employ an oxide-Si bond coat as described herein, in combination with an RE silicate or RE aluminosilicate EBC. Interlayers in such an embodiment can comprise RE-$HfO_2$ layered coatings. Various high stability coatings can be employed in various aspects of the innovation, which can include one or more of RE oxide doped $HfO_2$/$ZrO_2$, pyrochlores ($RE_2Zr_2O_7$-$RE_2Zr_2O_7$), perovskites (e.g., RE-$SrZrO_3$, etc.), magnetoplumbites (e.g., $REMgAl_{11}O_{19}$, etc.), or RE-Hafnia plus RE aluminosilicate composite coatings.

In aspects, embodiments of the subject innovation can also comprise other coats that can form an EBC system, such as top coats described herein. For example, top coats of the subject innovation can employ various materials, such as those of the form RE-$HfO_2$—X, RE-$HfO_2$-graded Silica, RE-$HfO_2$-Alumino Silicate, etc. Top coats can be applied via EB-PVD or other suitable techniques, such as EB-PVD $HfO_2$-$RE_2O_2$, etc.

As described above, coats and coat systems of the subject innovation can be applied via a variety of techniques, such as applied by Electron Beam-Physical Vapor Deposition (EB-PVD), Plasma-Spray Physical Vapor Deposition (PS-PVD), Plasma-Spray-Thin Film (PS-TF), High temperature Vacuum Vapor Deposition, Chemical vapor Deposition, etc. In one example, coatings comprising multicomponent RE silicate/$HfO_2$-RE-Silicate with distinct vapor pressures can be applied via EB-PVD with co-deposition. In another example, PS-PVD and/or PS-TF coating processes can be employed, with PVD splat coating processing at low pressure (e.g., around 1 torr, etc.). For complex-shape components, high velocity vapor and non-line-of-sight coating processing can be employed. PS techniques used herein can employ a high enthalpy plasma vapor stream for efficient and complex thin film coating processing.

What follows is a more detailed discussion of certain systems, methods, and apparatuses associated with aspects of the subject innovation. To aid in the understanding of aspects of the subject innovation, theoretical analysis and experimental results associated with specific experiments that were conducted are discussed herein. However, although for the purposes of obtaining the results discussed herein, specific choices were made as to the selection of various aspects of the experiments and associated setups—such as testing temperatures, durations, and environmental conditions—the systems and methods described herein can be employed in other contexts, as well. For example, various aspects of the subject innovation can be utilized to protect ceramic components in gas turbines or other engines, whether air-based, land-based, etc. In some embodiments, different selections of component materials for coatings can be selected than those used in the experiments discussed herein, and may have differing characteristics, as explained in greater detail below.

Figure 7:
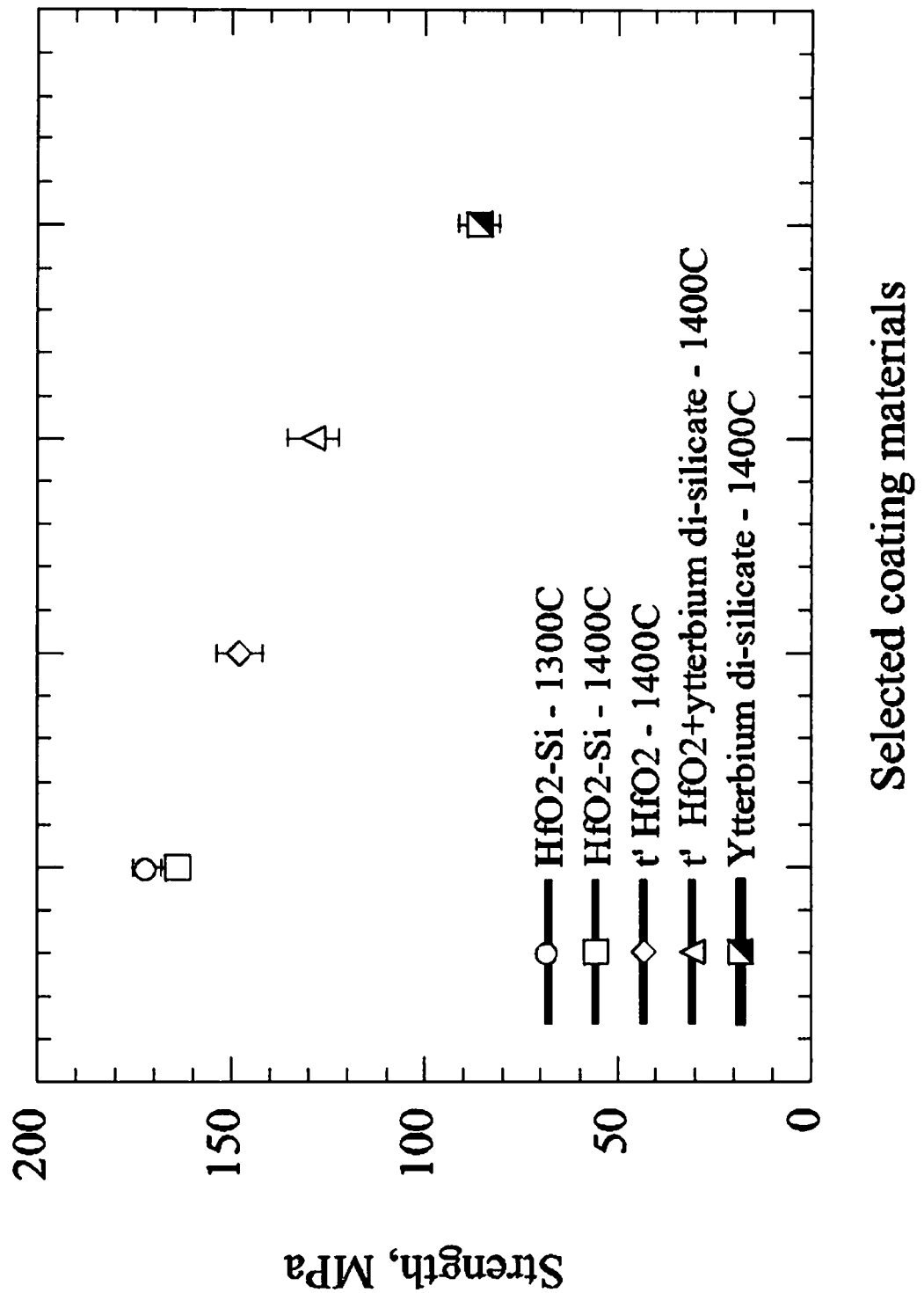
FIG. 7 illustrates the high temperature strength of several tested bond coat materials useable in aspects of the subject innovation.
Figure 8:
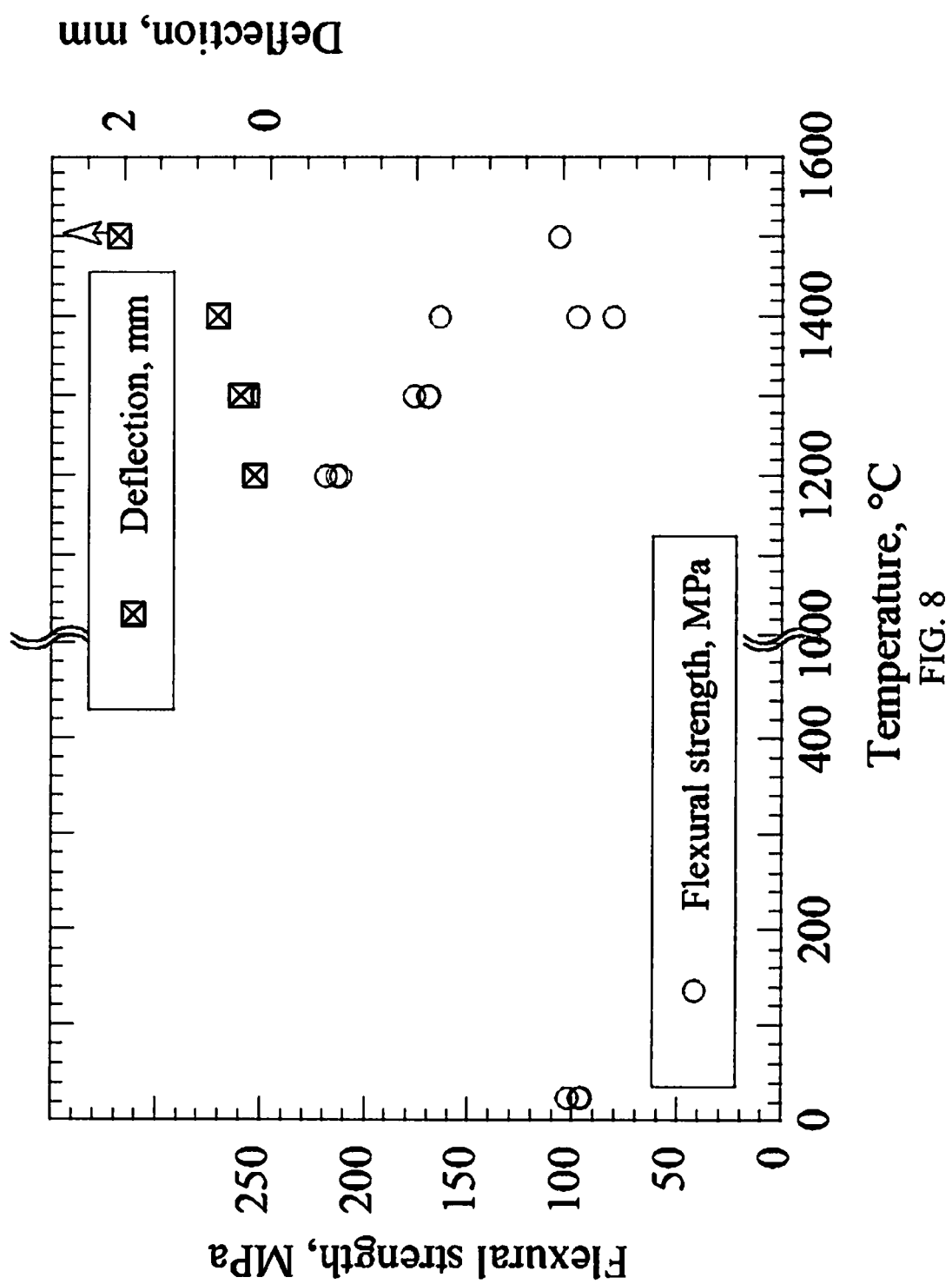
FIG. 8 illustrates the flexural strength and deflection of $HfO_2$—Si bond coat materials useable in aspects of the subject innovation at various temperatures.
Figure 9:
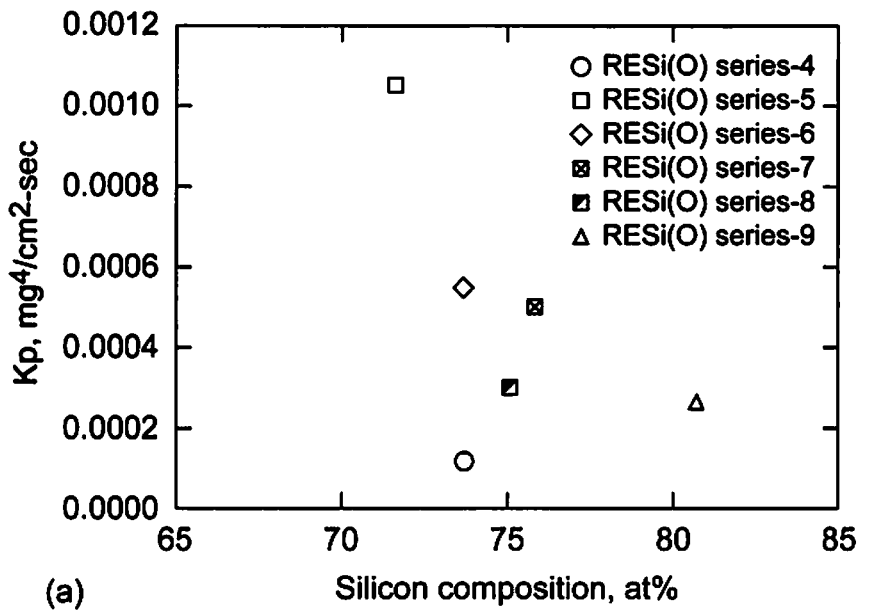
FIG. 9 illustrates testing results for RESi(O)-based bond coats.
Figure 9:
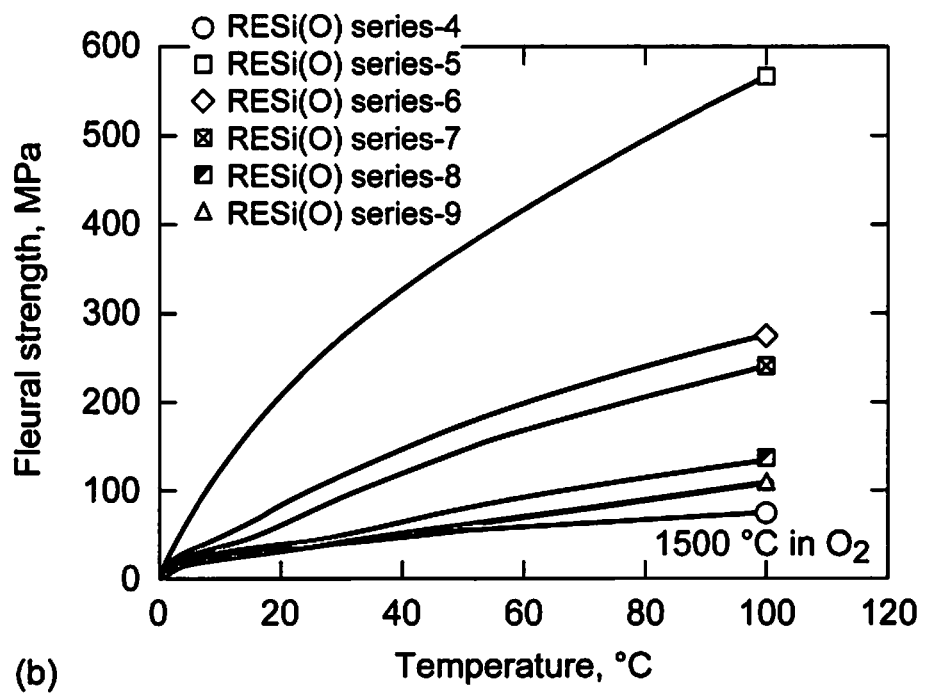
Figure 10:
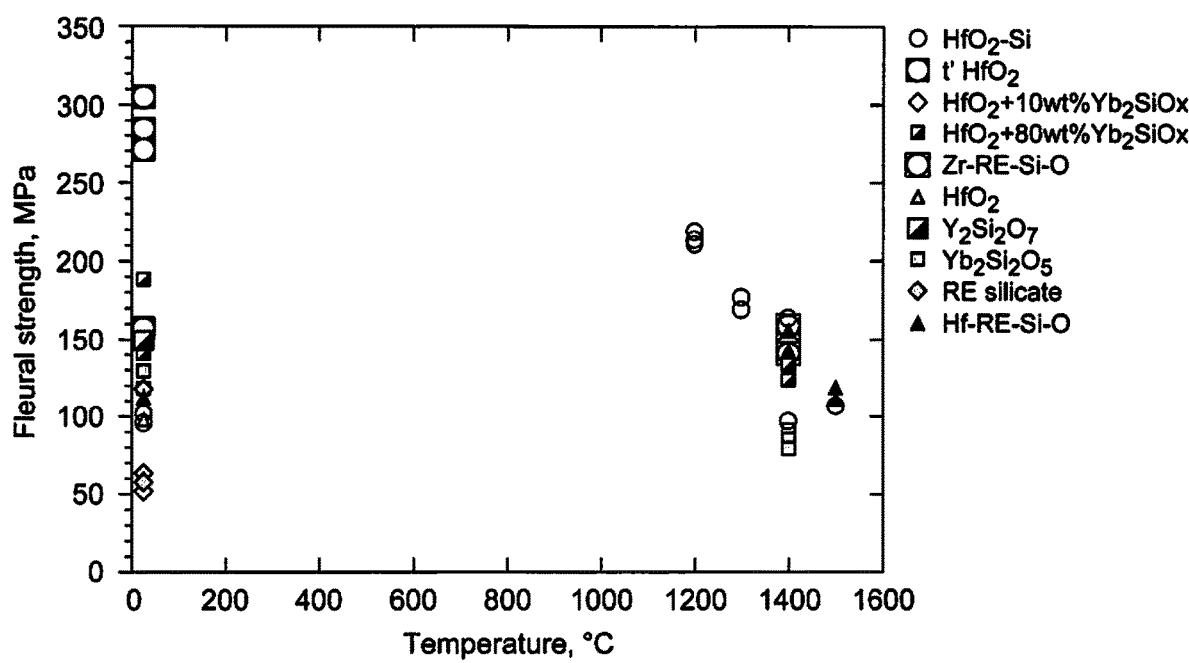
FIG. 10 illustrates flexural strength for various bond coats of the subject innovation at room temperature and elevated temperatures.

FIG. 7 illustrates the high temperature strength of several tested bond coat materials useable in aspects of the subject innovation. FIG. 8 illustrates the flexural strength and deflection of $HfO_2$—Si bond coat materials useable in aspects of the subject innovation at various temperatures. Compared with conventional systems, the bond coat systems of the subject innovation have excellent strength and toughness. Other tested bond coats included RESiO+X (Ta, Al, Hf, Zr, etc.) bond coats, RESi+X bond coats, Zr/Hf-RE-Si bond coats, etc. FIG. 9 illustrates testing results for RESiO-based bond coats, showing a Silicon concentration range that can provide for improved oxidation resistance at 1500° C. FIG. 10 illustrates flexural strength for various environmental barrier bond coats of the subject innovation at room temperature and elevated temperatures.

Several specific examples of coats and coat systems were developed as example embodiments of the innovation disclosed herein. These examples are included herein for the purposes of illustration; however, the subject innovation is not limited to these specific examples, but can include other embodiments that vary from these specific examples in one or more aspects.

As a first set of specific examples, coatings in accordance with various aspects of the subject innovation can comprise (a) Silicon cladded $HfO_2$ (e.g., agglomerated or sinter crushed $HfO_2$ powders, which can be at or near a 30:70 weight ratio of Si:$HfO_2$); (b) Yttrium monosilicate, with approximately a 50:50 molar ratio of $Y_2O_3$ and $SiO_2$ (i.e., around 78.984% weight and 21.016% weight, respectively); (c) Silicon cladded ytterbium monosilicate plus minor t' $HfO_2$ (e.g., in a weight ratio of approximately 30:60:10 of Si:Ytterbium monosilicate:t' $HfO_2$); (d) Silicon cladded ytterbium monosilicate (e.g., in a weight ratio of approximately 30:70 of Si:Ytterbium monosilicate); (e) Silicon cladded t' low k $ZrO_2$ plus ytterbium silicate (e.g., with a 30:30:40 weight ratio of Si:t' $ZrO_2$:ytterbium monosilicate); (f) Yttrium silicide cladded t' low k $ZrO_2$ plus ytterbium silicate (e.g., with a 30:30:40 weight ratio of Si:t' $ZrO_2$:ytterbium monosilicate); or (g) Compound t' $ZrO_2$—$HfO_2$ (with RE) plus ytterbium silicate approximately as in table 1:

TABLE 1

| Oxide | $ZrO_2$ | $HfO_2$ | $Y_2O_3$ | $Yb_2O_3$ | $Gd_2O_3$ |
|---|---|---|---|---|---|
| Mole % | Balance | 20 | 1.5 | 1.5 | 1.5 |
| Wt % | 62.077 | 28.090 | 2.260 | 3.944 | 3.628 |

As additional specific examples, bond coats in certain embodiments can comprise (a) Silicon with 30% atomic weight of Ytterbium; (b) alternating and co-deposition of 50% $Gd_2O_3$ with Si plus 30 at. % Yb and 50% $Yb_2O_3$ with Si plus 30 at. % Yb; or (c) a composite bond coat of $HfO_2$ with Si plus 30 at. % Yb. The thickness of these example bond coats can be in the range of 3 to 5 mils, although greater or lesser thicknesses can be used in various embodiments. In other examples, certain embodiments of bond coat systems can comprise (a) Silicon with 15% atomic weight of Gadolinium; (b) alternating and co-deposition of 50% $Gd_2O_3$ with Si and 50% $Yb_2O_3$ with Si; or (c) a composite bond coat of $HfO_2$ with Si plus 15 at. % Gd. As a second EBC layer, an alternating layer system can be employed with a total thickness of around 10 mils. A bottom system (of thickness around 5 mils) can be included that alternates between (a) $HfO_2$ (5% molar, 6.086% weight), $Y_2O_3$ (5% molar, 6.529% weight), $Gd_2O_3$ (5% molar, 20.962% weight), $Yb_2O_3$ (25% molar, 45.576% weight), with co-deposition of $SiO_2$ (60% molar, 20.847% weight) and (b) $HfO_2$ (96% molar, 90.7333% weight), $Y_2O_3$ (2% molar, 3.464% weight), $Gd_2O_3$ (1% molar, 2.780% weight), and $Yb_2O_3$ (1% molar, 3.023% weight). A top system can be included (also of thickness around 5 mils) that alternates between (a) $HfO_2$ (30% molar, 27.598% weight), $Y_2O_3$ (5% molar, 4.934% weight), $Gd_2O_3$ (5% molar, 7.921% weight), $Yb_2O_3$ (30% molar, 51.669% weight), with co-deposition of $SiO_2$ (30% molar, 7.878% weight) and (b) $HfO_2$ (96% molar, 90.7333% weight), $Y_2O_3$ (2% molar, 3.464% weight), $Gd_2O_3$ (1% molar, 2.780% weight), and $Yb_2O_3$ (1% molar, 3.023% weight). $SiO_2$ grading can be used with both. As with other specific examples provided herein for the purposes of illustration, it is to be appreciated that the chemical compositions can vary from the specific ratios provided, while remaining within the scope of the subject innovation.

FIGS. 11A, 11B, and 11C include other specific examples of compositions useable in connection with various aspects of the subject innovation; again, these examples are provided for purposes of illustration, and are not intended to be limiting.

The subject innovation, in various embodiments, can provide bond coat systems that can be critical for future development of advanced high performance gas turbine engine applications. The environmental barrier bond coating system is one of the most critical technologies that can lead to the future realization of SiC/SiC CMC turbine engine combustor liners and vanes, and turbine blades, allowing the engines to be operated at much higher temperatures with significantly reduced cooling requirements. This technology can be also used in a variety of other settings in which ceramic components will be subjected to extreme temperature or environmental conditions, such as land-based stationary gas turbines for power generation, and other energy related heat engine systems.

What has been described above includes examples of the innovation. It is, of course, not possible to describe every conceivable combination of components or methodologies for purposes of describing the subject innovation, but one of ordinary skill in the art may recognize that many further combinations and permutations of the innovation are possible. Accordingly, the innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. An article, comprising:
   a substrate; and
   a bond coat system in contact with the substrate, wherein the bond coat system comprises a bond coat layer, and wherein the bond coat layer comprises a first component comprising a rare earth doped iron silicide and a second component comprising at least one oxide.

2. The article of claim 1, wherein the at least one oxide comprises $HfO_2$.

3. The article of claim 1, wherein the bond coat layer comprises a layered composite comprising alternating layers of the first and second components.

4. The article of claim 1, wherein the bond coat layer comprises a mixture phased region with low oxygen activities, wherein the mixture phased region has a silicon concentration that decreases with increasing distance from the substrate.

5. The article of claim 1, wherein the bond coat system comprises a first interlayer between the bond coat layer and the substrate, and a second interlayer in contact with a face of the bond coat layer opposite the substrate.

6. The article of claim 5, wherein at least one of the first interlayer or the second interlayer comprises one of a silicon alloy, hafnium oxide, zirconium oxide, and a rare earth oxide.

7. The article of claim 1, further comprising an environmental barrier coating top coat in contact with a face of the bond coat system opposite the substrate.

8. The article of claim 7, wherein the environmental barrier top coat comprises one or more of a rare earth silicate and a rare earth aluminosilicate.

9. The article of claim 1, wherein the bond coat layer comprises one or more rare earth oxide dopants.

10. The article of claim 1, wherein the bond coat layer comprises at least 40% silicon by atomic percentage.

11. The article of claim 1, wherein the bond coat layer has a thickness less than or equal to forty micrometers.

12. The article of claim 1, wherein the bond coat layer self-grows an environmental barrier coating.

13. The article of claim 1, wherein the bond coat layer has a flexural strength of at least 100 MPa at one or more temperatures in the range from 1400° C. to 1500° C.

14. An article, comprising:
    a substrate; and
    a bond coat system in contact with the substrate, wherein the bond coat system comprises a first interlayer in contact with the substrate, a bond coat layer in contact with the first interlayer, and a second interlayer in contact with the bond coat layer, wherein the bond coat layer comprises a rare earth doped iron silicide and at least one oxide, wherein the bond coat comprises at least 40% silicon by atomic percentage.

* * * * *